United States Patent
Colinge et al.

(10) Patent No.: US 9,929,245 B2
(45) Date of Patent: Mar. 27, 2018

(54) SEMICONDUCTOR STRUCTURES AND METHODS FOR MULTI-LEVEL WORK FUNCTION

(71) Applicant: Taiwan Semiconductor Manufacturing Company Limited, Hsinchu (TW)

(72) Inventors: Jean-Pierre Colinge, Hsinchu (TW); Chia-Wen Liu, Taipei (TW); Wei-Hao Wu, Hsinchu (TW); Chih-Hao Wang, Hsinchu County (TW); Carlos H. Diaz, Mountain View, CA (US)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/401,171

(22) Filed: Jan. 9, 2017

(65) Prior Publication Data

US 2017/0117377 A1    Apr. 27, 2017

Related U.S. Application Data

(60) Division of application No. 14/469,682, filed on Aug. 27, 2014, now Pat. No. 9,564,431, which is a
(Continued)

(51) Int. Cl.
*H01L 29/49* (2006.01)
*H01L 29/423* (2006.01)
(Continued)

(52) U.S. Cl.
CPC ........ *H01L 29/4908* (2013.01); *H01L 27/092* (2013.01); *H01L 29/0676* (2013.01);
(Continued)

(58) Field of Classification Search
CPC ............... H01L 29/42392; H01L 29/41; H01L 29/4238; H01L 29/42384; H01L 29/7788;
(Continued)

(56) References Cited

U.S. PATENT DOCUMENTS

2008/0251825 A1    10/2008   Lee
2014/0209998 A1*   7/2014    Masuoka .......... H01L 29/42392
                                                        257/329

FOREIGN PATENT DOCUMENTS

TW           200939401          9/2009

OTHER PUBLICATIONS

Taiwan Office Action; Application No. 103146495; dated Mar. 13, 2017.

* cited by examiner

*Primary Examiner* — Thanhha Pham
(74) *Attorney, Agent, or Firm* — Jones Day

(57) ABSTRACT

Semiconductor devices and methods for forming semiconductor devices are provided. A vertical channel structure extends from a substrate and is formed as a channel between a source region and a drain region. A first metal gate surrounds a portion of the vertical channel structure and has a gate length. The first metal gate has a first gate section with a first workfunction and a first thickness. The first metal gate also has a second gate section with a second workfunction and a second thickness. The first thickness is different from the second thickness, and the sum of the first thickness and the second thickness is equal to the gate length. A ratio of the first thickness to the second thickness is chosen to achieve a desired threshold voltage level for the semiconductor device.

20 Claims, 16 Drawing Sheets

Related U.S. Application Data continuation-in-part of application No. 14/184,094, filed on Feb. 19, 2014, now Pat. No. 9,620,591.

(51) Int. Cl.
| | |
|---|---|
| *H01L 29/778* | (2006.01) |
| *H01L 29/78* | (2006.01) |
| *H01L 21/8228* | (2006.01) |
| *H01L 29/06* | (2006.01) |
| *H01L 29/786* | (2006.01) |
| *H01L 27/092* | (2006.01) |
| *H01L 29/66* | (2006.01) |
| *H01L 29/41* | (2006.01) |

(52) U.S. Cl.
CPC .......... *H01L 29/41* (2013.01); *H01L 29/4238* (2013.01); *H01L 29/42384* (2013.01); *H01L 29/42392* (2013.01); *H01L 29/66742* (2013.01); *H01L 29/7788* (2013.01); *H01L 29/78642* (2013.01); *H01L 2029/42388* (2013.01)

(58) Field of Classification Search
CPC ............. H01L 29/4908; H01L 29/7827; H01L 29/7828; H01L 29/7831; H01L 29/7842; H01L 27/092; H01L 27/2454; H01L 21/82285

See application file for complete search history.

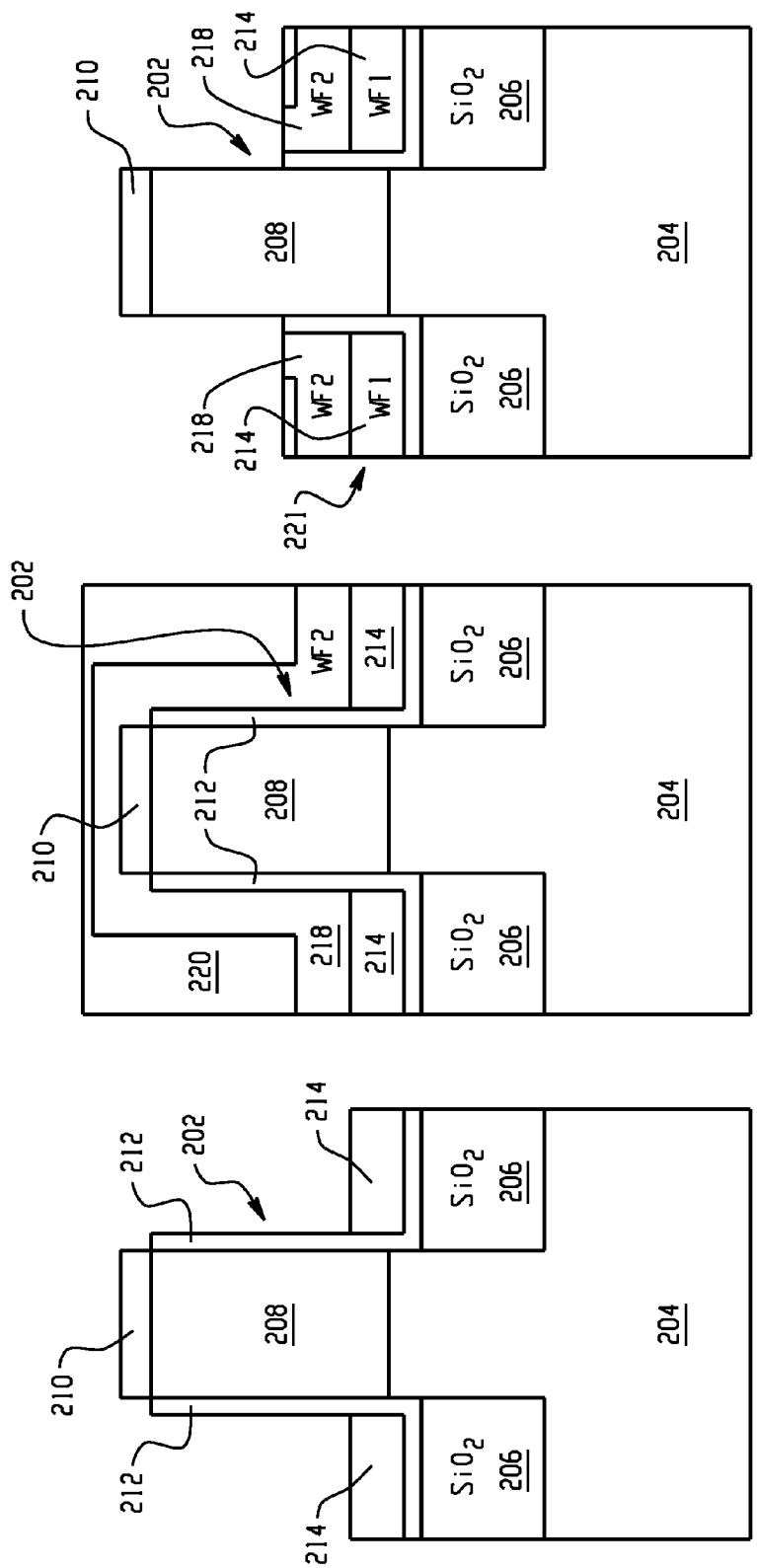

SEMICONDUCTOR STRUCTURES AND METHODS FOR MULTI-LEVEL WORK FUNCTION

CROSS-REFERENCE TO RELATED APPLICATIONS

This application is a divisional application of U.S. patent application Ser. No. 14/469,682, entitled "Semiconductor Structures and Methods for Multi-Level Work Function," filed Aug. 27, 2014, which is a continuation-in-part of U.S. patent application Ser. No. 14/184,094, entitled "Semiconductor Structures And Methods For Multi-Level Work Function And Multi-Valued Channel Doping Of Nanowire Transistors To Improve Drive Current," filed Feb. 19, 2014, both of which are incorporated herein by reference in their entireties.

BACKGROUND

The technology described in this patent document relates generally to semiconductor devices and more particularly to vertical channel semiconductor devices.

Scaling of semiconductor devices, such as a metal-oxide semiconductor field-effect transistor (MOSFET), has enabled continued improvement in speed, performance, density, and cost per unit function of integrated circuits over the past few decades. Improvements to vertical channel devices can further the scaling of integrated circuits.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 5A-5F are drawings depicting example states of a semiconductor structure during fabrication of a semiconductor device having multiple gate sections with different workfunction levels, in accordance with some embodiments.

DETAILED DESCRIPTION

Figure 1A:
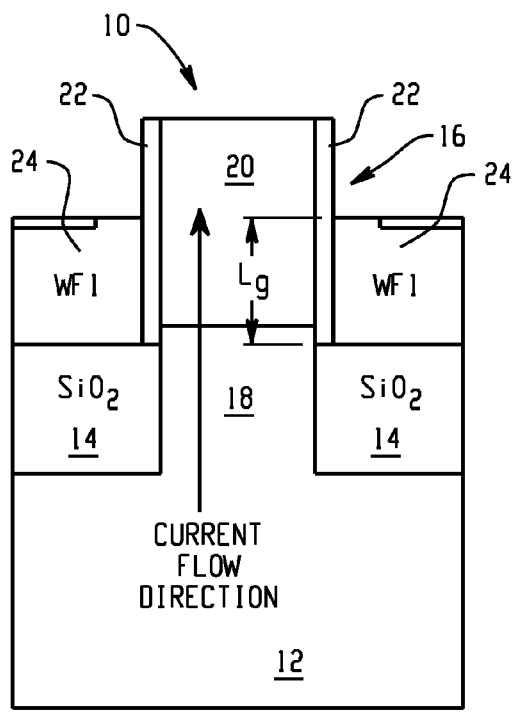
FIGS. 1A, 1B, and 1C are diagrams illustrating cross-sectional views of the channel region of example vertical-gate-all-around (VGAA) semiconductor devices, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a diagram illustrating a cross-sectional view of the channel region of an example vertical-gate-all-around (VGAA) semiconductor device 10. The example VGAA device 10 includes a substrate 12, a dielectric layer 14 comprising $SiO_2$ in this example above the substrate 12, and a vertical channel region 16 comprising a substrate section 18 and a vertically grown channel region 20. The vertically grown channel region 20 in this example is formed using nanowire technology. The example VGAA device 10 also includes a gate insulator 22, such as a hi-K dielectric gate insulator, and a gate metal layer 24 of length $L_G$. The gate metal layer 24 has a first workfunction level WF1. The workfunction level of the metal gate layer 24 will affect the threshold voltage level of the VGAA device 10.

Figure 1B:
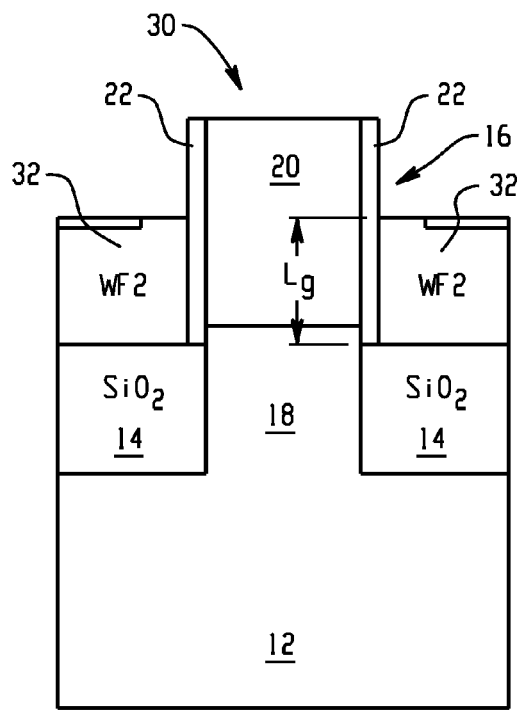

FIG. 1B is a diagram illustrating a cross-sectional view of the channel region of another example vertical-gate-all-around (VGAA) semiconductor device 30. The example VGAA device 30 is similar to the example VGAA device 10 of FIG. 1A and also includes a substrate 12, an oxide layer 14 comprising $SiO_2$, a vertical channel region 16 comprising a substrate section 18 and a vertically grown channel region 20, and a gate insulator 22. The example VGAA device 30 includes a gate metal layer 32 also of length $L_G$ that has a second workfunction level WF2 that is different from the first workfunction level WF1. The second workfunction level WF2 of the metal gate layer 32 will cause the threshold voltage level of the VGAA device 30 to differ from that of the VGAA device 10.

Figure 1C:
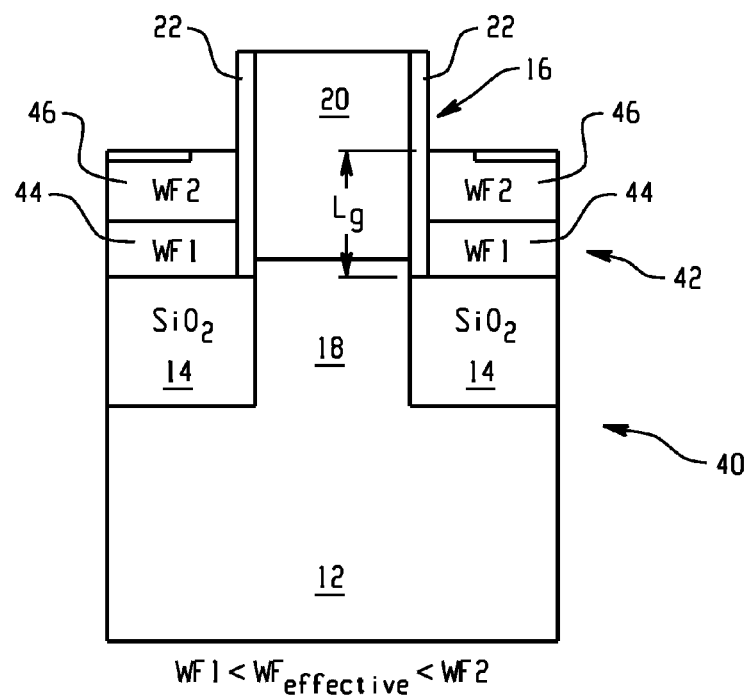

FIG. 1C is a diagram illustrating a cross-sectional view of the channel region of yet another example vertical-gate-all-around (VGAA) semiconductor device 40. The example VGAA device 40 is similar to the example VGAA device 10 of FIG. 1A and the example VGAA device 30 of FIG. 1B. The example VGAA device 40 also includes a substrate 12, an oxide layer 14 comprising $SiO_2$, a vertical channel region 16 comprising a substrate section 18 and a vertically grown channel region 20, and a gate insulator 22. The example VGAA device 40 includes a gate metal layer 42 also of length $L_G$ that has a first workfunction WF1 section 44 and a second workfunction WF2 section 46. The combination of the first workfunction section and the second workfunction WF2 section in the metal gate layer 42 will cause the threshold voltage level of the VGAA device 40 to fall between that of the VGAA device 10 and the VGAA device 30.

Figure 2A:
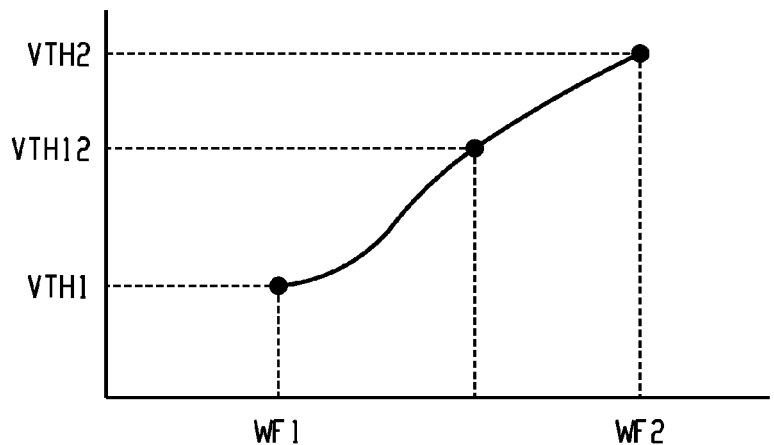
FIGS. 2A, 2B, and 2C are diagrams illustrating that the percentage of gate length occupied by different metal layers in a metal gate can be configured to set a threshold voltage level for a device, in accordance with some embodiments.
Figure 2B:
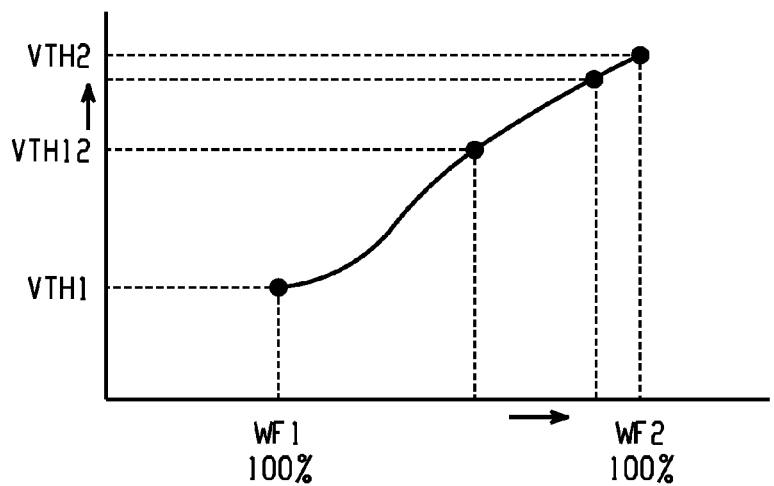

If the VGAA device 10, the VGAA device 30, and the VGAA device 40 are N-channel transistors, the threshold voltage (VTH) increases with the value of the metal workfunction. If the WF2 level is greater than the WF1 level, then the threshold voltage (VTH2) of a device with the WF2 level is higher than the threshold voltage (VTH1) of a device with the WF1 level as illustrated in the graph of FIG. 2A. Also, as illustrated in FIG. 2A, a device with a WF1/WF2 stack (and gate length $L_G$) will have a threshold voltage VTH12 between VTH1 and VTH2. FIG. 2B is a line graph illustrating that by increasing the thickness of WF2 metal (and thus reducing accordingly the thickness of metal WF1 to keep $L_G$ constant ($L_G$=thickness of WF1+thickness of WF2)), the threshold voltage may increase monotonically from VTH1 to VTH2.

Figure 2C:
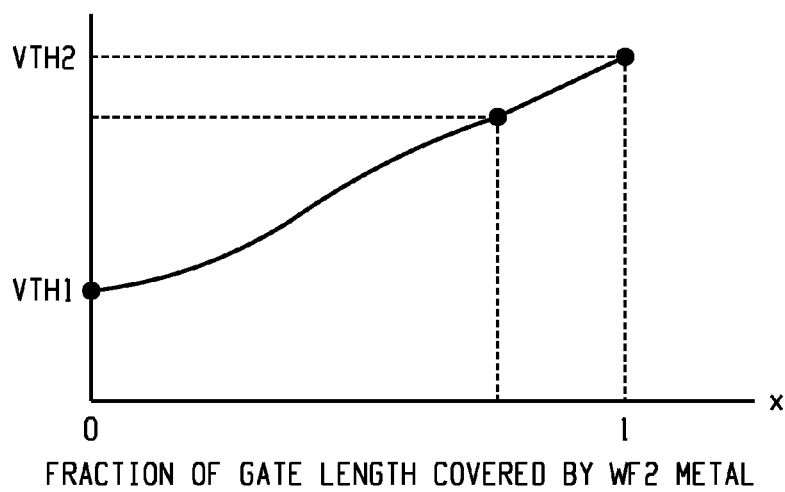

FIG. 2C is a line graph illustrating that the percentage of gate length occupied by WF1 and WF2 can be configured to set a threshold voltage for a device between VTH1 and VTH2. If x is defined as the percentage of gate length $L_G$ covered by WF2, the thickness of WF2=x $L_G$ and the thickness of WF=(1−x) $L_G$. If x=0, the gate is 100% made of metal WF1 and the threshold voltage is VTH1. If x=1, the gate is 100% made of metal WF2 and the threshold voltage is VTH2. Finally, if 0<x<1 the threshold voltage is between VTH1 and VTH2.

Figure 3:
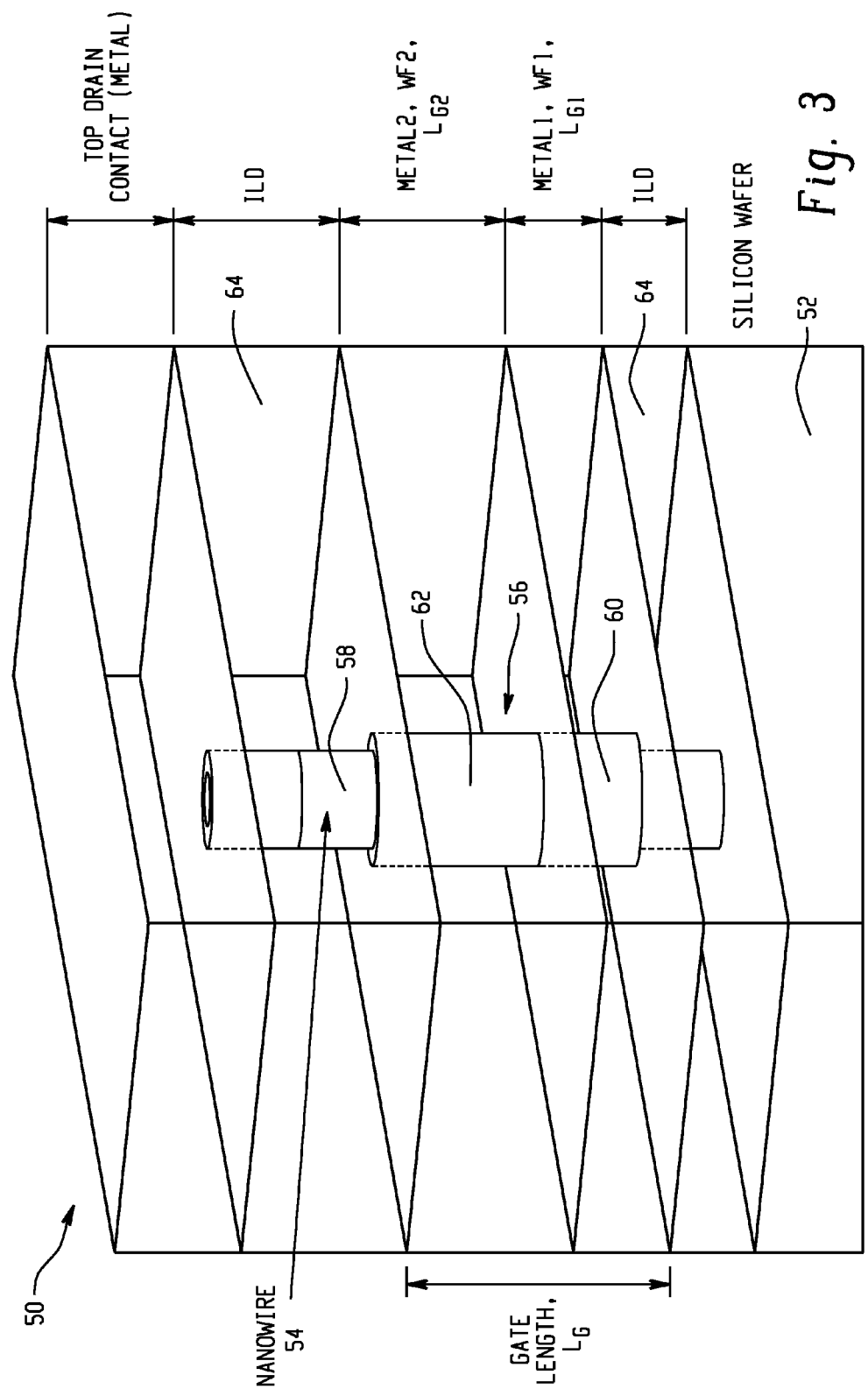
FIG. 3 is a block diagram of an example semiconductor device that is formed using nanowire technology, in accordance with some embodiments.

FIG. 3 is a block diagram of an example semiconductor device 50 that is formed using nanowire technology. The device 50 is fabricated on a substrate 52. In this example, the substrate 52 comprises a bulk substrate, although other substrate structures such as silicon-on-insulator (SOI) may be used. In some embodiments the bulk substrate can include an elementary semiconductor including silicon or germanium in crystal, polycrystalline, or an amorphous structure; a compound semiconductor including silicon carbide, gallium arsenide, gallium phosphide, indium phosphide, indium arsenide, and indium antimonide; an alloy semiconductor including SiGe, SiGeSn, GeSn, GaAsP, AlInAs, AlGaAs, GaInAs, GaInP, and GaInAsP; any other suitable material; or combinations thereof. In some embodiments the bulk substrate can include p-type material and in other embodiments the bulk substrate can include n-type material. The substrate 52 may include isolation regions, doped regions, and/or other features.

The example semiconductor device 50 further includes a source region (not shown) in the substrate 52, one or more nanowire structures 54, and gate material 56 of length $L_G$ above the substrate and surrounding a middle portion of the nanowire structures 54. The nanowire structures 54 in this example are oriented in a vertical direction and extend upwardly from the source region. In other examples, the nanowire structures may extend in other directions such as a horizontal direction. Also, although nanowires with a circular cross-sectional shape are shown in this example, in other examples the cross-sectional shape may include circular, square, rectangular, triangular, trapezoidal, or other shapes. The example nanowire structure 54 comprises semiconductor material such as silicon that is used to form a channel region between the source region and a drain region (not shown). The drain region in this example is at the far end section of the nanowire structure 54 opposite the source region. Gate oxide 58 is also shown surrounding the nanowire structure 54 and sandwiched between the gate material 56 and the nanowire structure 54. The gate material 56 in this example comprises a first gate metal section 60 with a first workfunction level and a first thickness and a second gate metal section 62 with a second workfunction level and a second thickness. The example semiconductor device 50 further includes insulation material (ILD) 64 above the substrate 52 and surrounding the nanowire structures 54.

Figure 4:
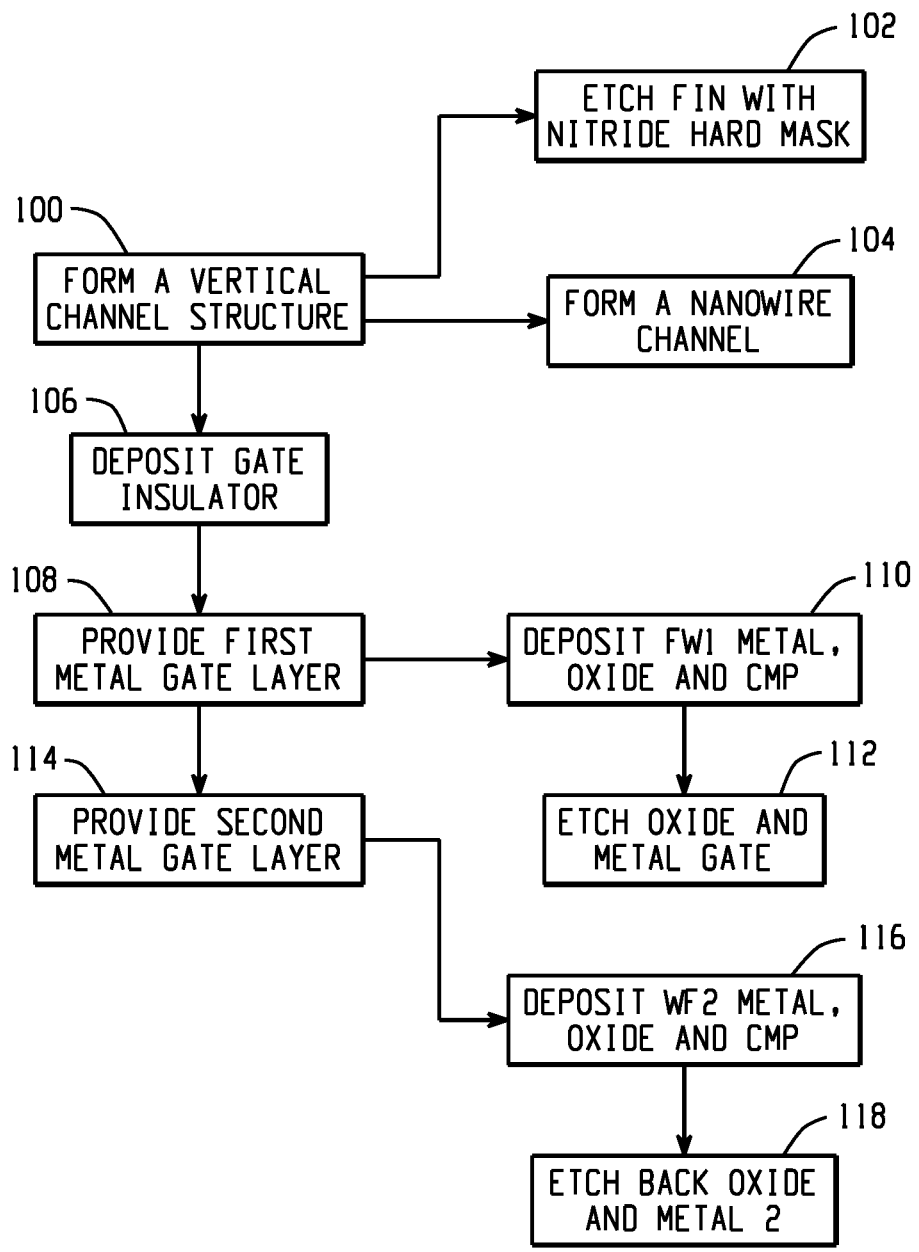
FIG. 4 is a process flow chart illustrating an example method of fabricating a semiconductor device having multiple gate sections with different workfunction levels, in accordance with some embodiments.
Figure 5C:
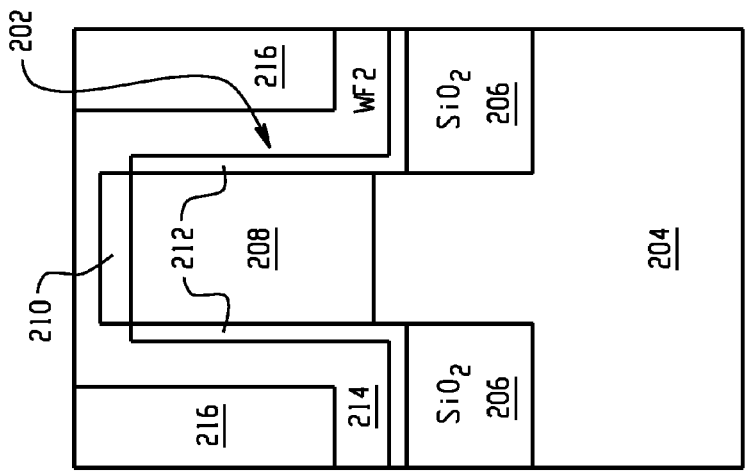
Figure 5B:
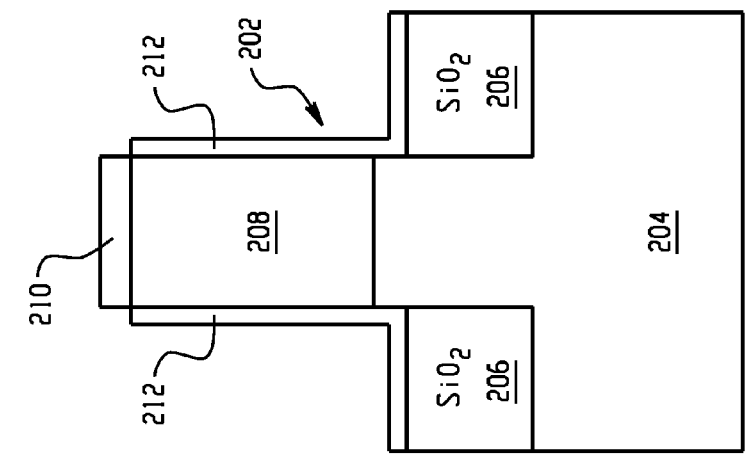
Figure 5A:
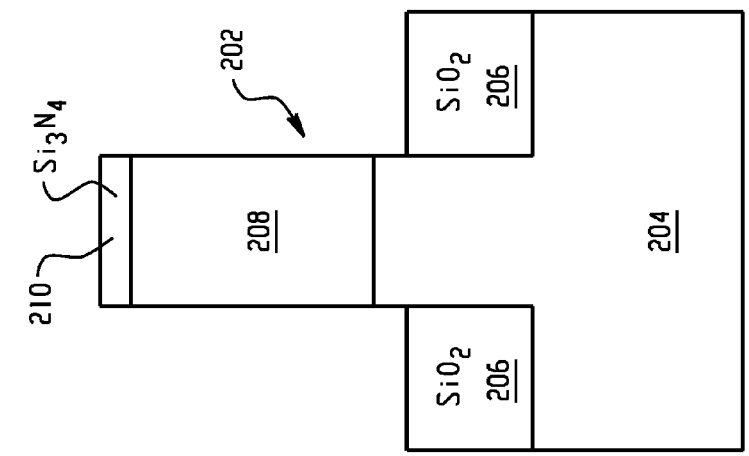

FIG. 4 is a process flow chart illustrating an example method of fabricating a semiconductor device having multiple gate sections with different workfunction levels. A vertical channel structure extending from a substrate and formed as a channel between a source region and a drain region is formed (operation 100). The vertical channel structure may comprise various structures such as a fin that was etched from the substrate (option 102) and/or a nanowire that was grown above the substrate (option 104). FIG. 5A provides a cross-sectional view of an example semiconductor structure after forming a vertical channel structure 202 on a substrate 204 with an oxide region 206 by etching a fin 208 with a nitride hard mask 210.

Referring back to FIG. 4, after forming a vertical channel structure, a gate insulator is deposited above the oxide region and around the vertical channel structure (operation 106). FIG. 5B provides a cross-sectional view of an example semiconductor structure after a gate insulator 212 has been deposited above the oxide region 206 and around the vertical channel structure 202.

Referring back to FIG. 4, after depositing a gate insulator, a first metal gate layer is provided (operation 108). Providing a first metal gate layer may comprise depositing a first metal layer having a first workfunction level followed by depositing an oxide layer, and further followed by chemical mechanical polishing (CMP) operations (operation 110). The first metal layer and oxide layer may then be etched to leave a first metal layer having a first thickness level (operation 112). FIG. 5C provides a cross-sectional view of an example semiconductor structure after a first metal layer 214 and oxide 216 have been deposited. FIG. 5D provides a cross-sectional view of an example semiconductor structure after etching the first metal layer 214 and oxide to the first thickness level.

Referring back to FIG. 4, after providing a first metal gate layer, a second metal gate layer is provided (operation 114). Providing a second metal gate layer may comprise depositing a second metal layer having a second workfunction level followed by depositing an oxide layer, and further followed by chemical mechanical polishing (CMP) operations (operation 116). The second metal layer and oxide layer may then be etched to leave a second metal layer having a second thickness level (operation 118). The first thickness level and the second thickness level can be chosen to produce a metal gate having a desired gate length. FIG. 5E provides a cross-sectional view of an example semiconductor structure after a second metal layer 218 and oxide 220 have been deposited.

FIG. 5F provides a cross-sectional view of an example semiconductor structure after etching the second metal layer 218 and oxide 220 to the second thickness level. Shown is a semiconductor structure comprising a vertical channel structure 202 extending from a substrate 204 and formed as a channel between a source region and a drain region. The semiconductor structure further comprises a metal gate 221 that surrounds a portion of the vertical channel structure 202. The metal gate 221 has a gate length. The metal gate 221 has a first gate section 214 with a first workfunction and a first thickness. The metal gate also has a second gate section 218 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device.

Figure 6:
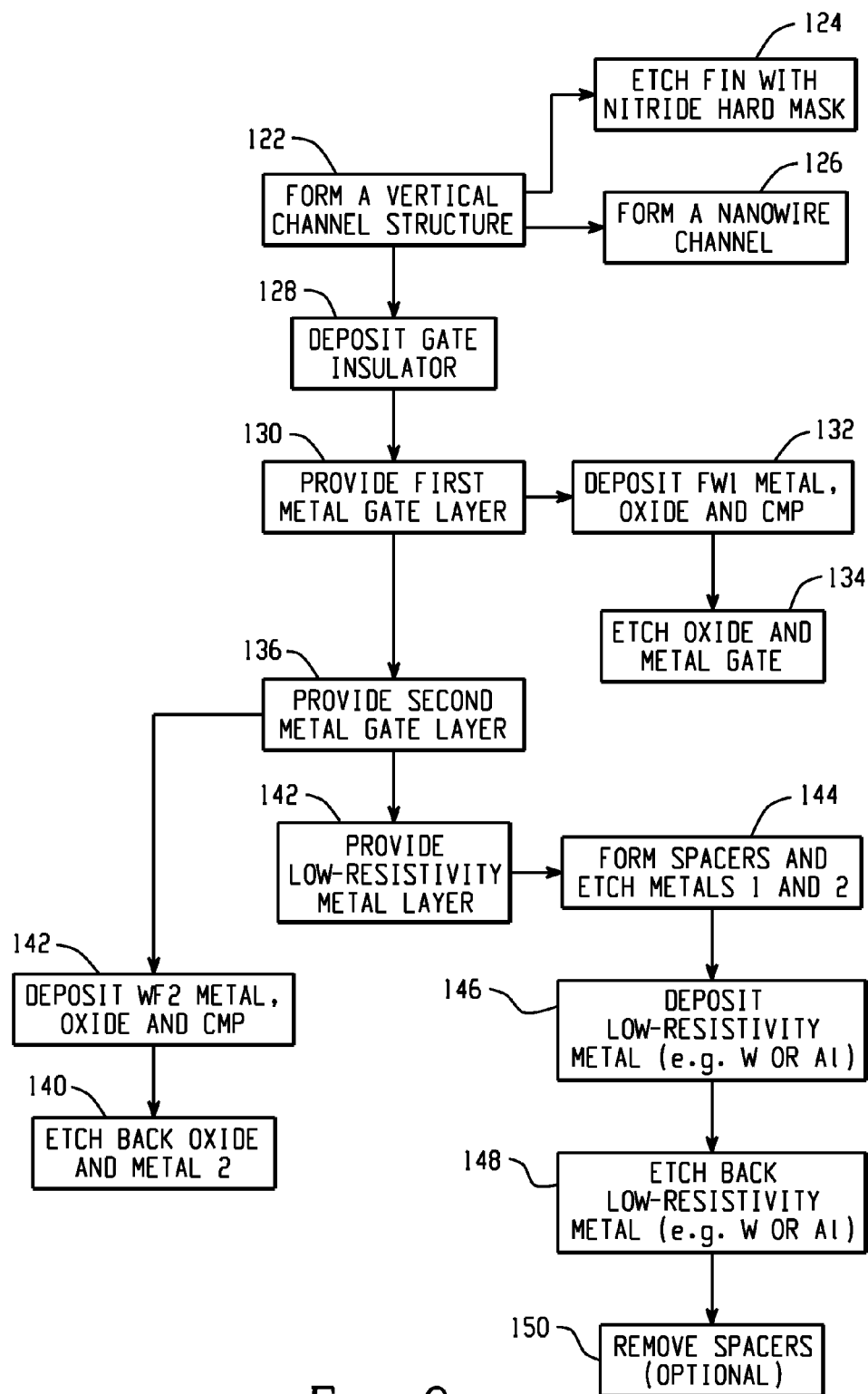
FIG. 6 is a process flow chart illustrating an example method of fabricating a semiconductor device having multiple gate sections with different workfunction levels, in accordance with some embodiments.
Figure 7A:
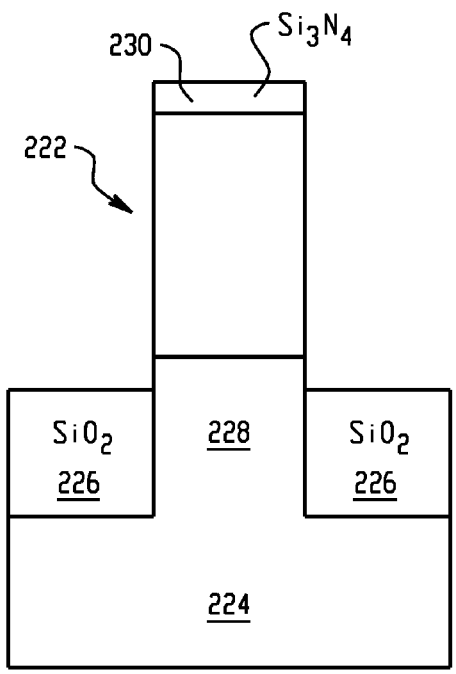
FIGS. 7A-7J are drawings depicting example states of a semiconductor structure during fabrication of a semiconductor device having multiple gate sections with different workfunction levels, in accordance with some embodiments.

FIG. 6 is a process flow chart illustrating another example method of fabricating a semiconductor device having multiple gate sections with different workfunction levels. A vertical channel structure extending from a substrate and formed as a channel between a source region and a drain region is formed (operation 122). The vertical channel structure may comprise various structures such as a fin that was etched from the substrate (option 124) and/or a nanowire that was grown above the substrate (option 126). FIG. 7A provides a cross-sectional view of an example semiconductor structure after forming a vertical channel structure 222 on a substrate 224 with an oxide region 226 by etching a fin 228 with a nitride hard mask 230.

Figure 7B:
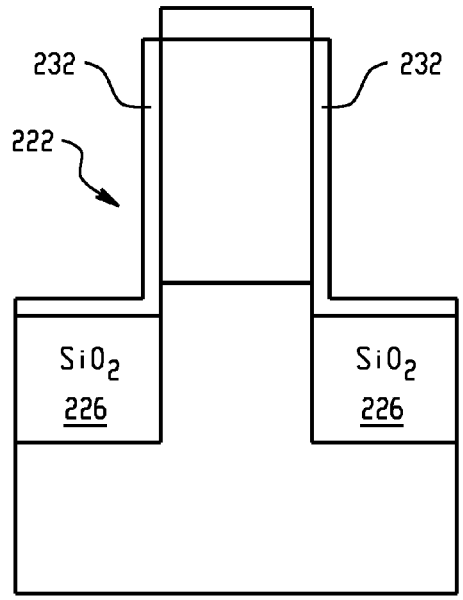

Referring back to FIG. 6, after forming a vertical channel structure, a gate insulator is deposited above the oxide region and around the vertical channel structure (operation 128). FIG. 7B provides a cross-sectional view of an example semiconductor structure after a gate insulator 232 has been deposited above the oxide region 226 and around the vertical channel structure 222.

Figure 7C:
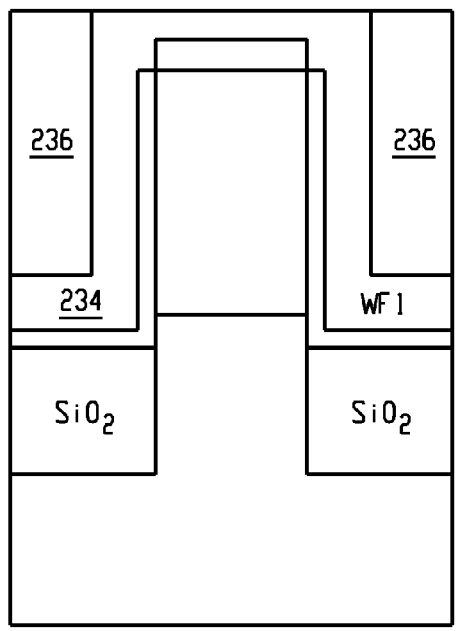
Figure 7D:
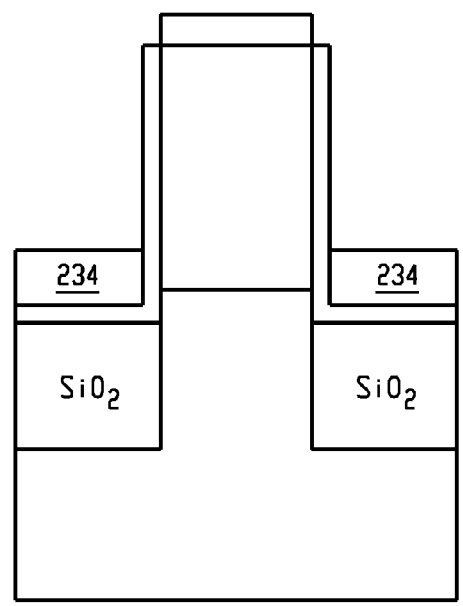

Referring back to FIG. 6, after depositing a gate insulator, a first metal gate layer is provided (operation 130). Providing a first metal gate layer may comprise depositing a first metal layer having a first workfunction level followed by depositing an oxide layer, and further followed by chemical mechanical polishing (CMP) operations (operation 132). The first metal layer and oxide layer may then be etched to leave a first metal layer having a first thickness level (operation 134). FIG. 7C provides a cross-sectional view of an example semiconductor structure after a first metal gate layer 234 and oxide 236 have been deposited. FIG. 7D provides a cross-sectional view of an example semiconductor structure after etching the first metal gate layer 234 and oxide to the first thickness level.

Figure 7E:
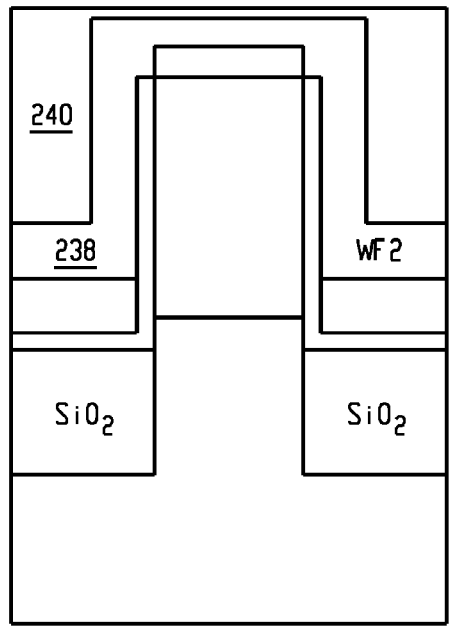
Figure 7F:
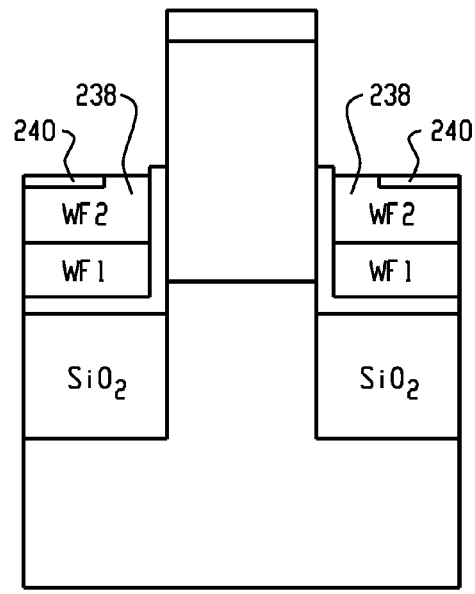

Referring back to FIG. 6, after providing a first metal gate layer, a second metal gate layer is provided (operation 136). Providing a second metal gate layer may comprise depositing a second metal layer having a second workfunction level followed by depositing an oxide layer, and further followed by chemical mechanical polishing (CMP) operations (operation 138). The second metal layer and oxide layer may then be etched to leave a second metal layer having a second thickness level (operation 140). The first thickness level and the second thickness level can be chosen to produce a metal gate having a desired gate length. FIG. 7E provides a cross-sectional view of an example semiconductor structure after a second metal layer 238 and oxide 240 have been deposited. FIG. 7F provides a cross-sectional view of an example semiconductor structure after etching the second metal layer 238 and oxide 240 to the second thickness level.

Referring back to FIG. 6, a low resistivity metal layer can be provided around the first workfunction metal layer and the second workfunction metal layer stack (operation 142). This may comprise forming a spacer and etching back the first workfunction metal layer and the second workfunction metal layer stack (operation 144). Next, low resistivity metal, such as W or Al, may be deposited (operation 146). The low resistivity metal may be etched back to the desired height (operation 148). Finally, the spacers may be optionally removed (operation 150).

Figure 7G:
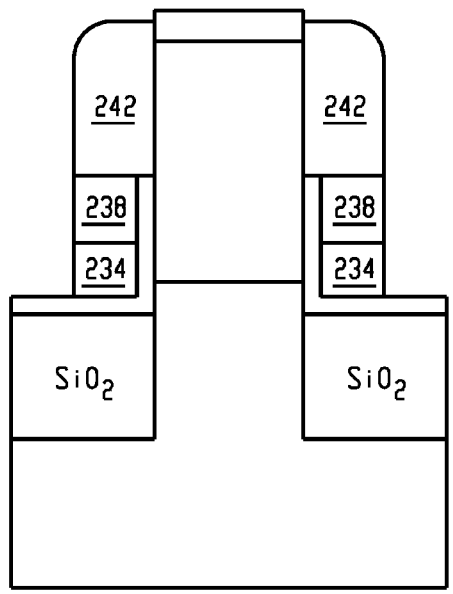
Figure 7H:
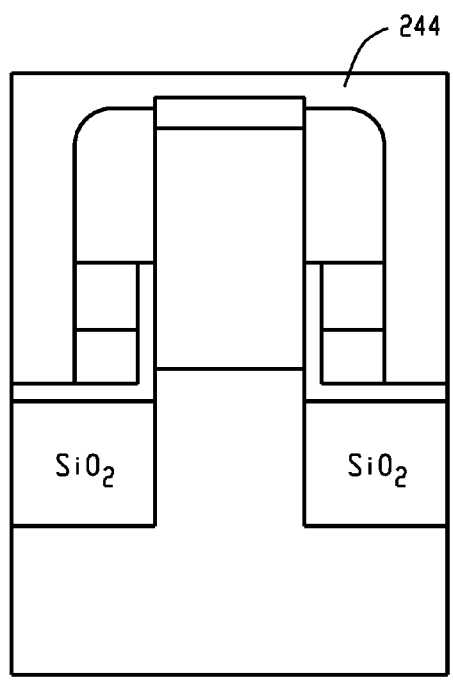
Figure 7I:
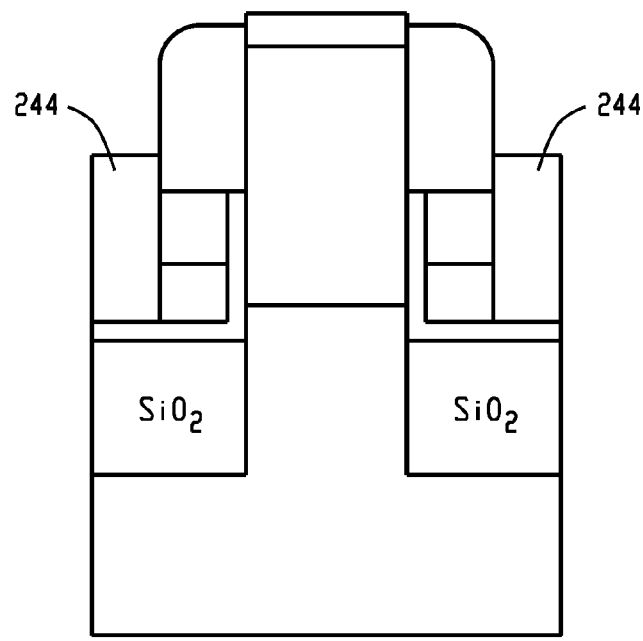

FIG. 7G provides a cross-sectional view of an example semiconductor structure after forming a spacer 242 and etching back the first workfunction metal layer 234 and the second workfunction metal layer 238. FIG. 7H provides a cross-sectional view of an example semiconductor structure after depositing a low resistivity metal 244, such as W or Al. FIG. 7I provides a cross-sectional view of an example semiconductor structure after the low resistivity metal 244 has been etched back to the desired height.

Figure 7J:
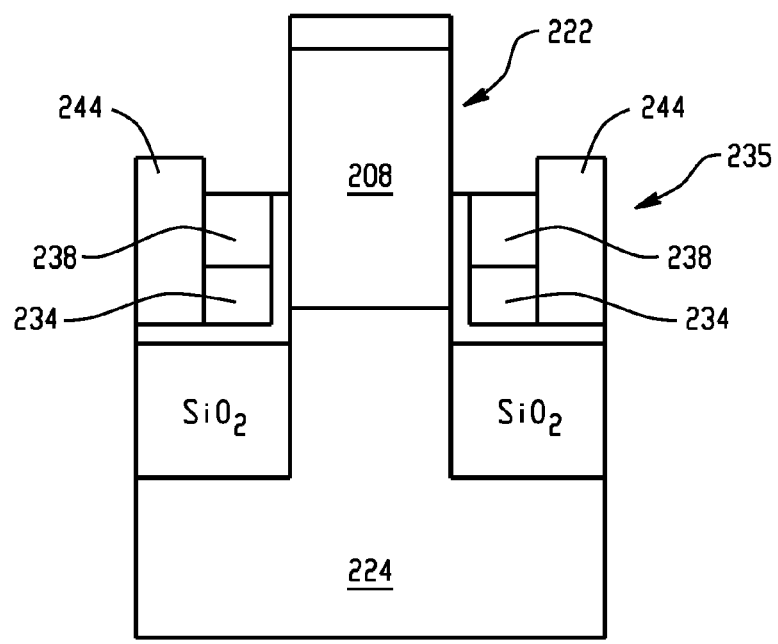

FIG. 7J provides a cross-sectional view of an example semiconductor structure after removing the spacers. Shown is a semiconductor structure comprising a vertical channel structure 222 extending from a substrate 224 and formed as a channel between a source region and a drain region. The semiconductor structure further comprises a metal gate 235 that surrounds a portion of the vertical channel structure. The metal gate 235 has a gate length. The metal gate 235 has a first gate section 234 with a first workfunction and a first thickness. The metal gate 235 also has a second gate section 238 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. The first metal gate 235 further comprises low resistivity metal 244 surrounding the first metal gate section 236 and the second metal gate section 238.

Figure 8:
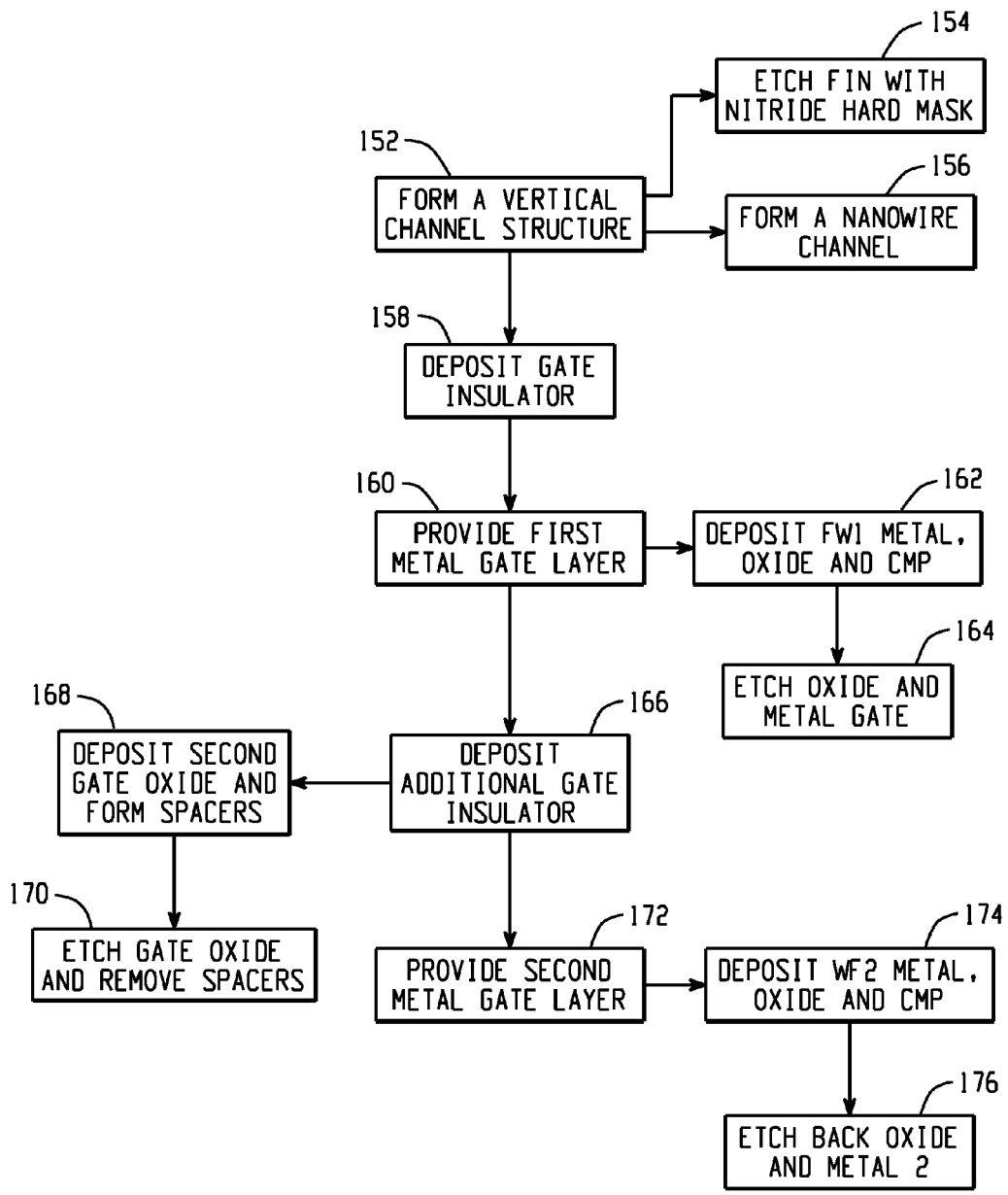
FIG. 8 is a process flow chart illustrating an example method of fabricating a semiconductor device having multiple gate sections with different workfunction levels, in accordance with some embodiments.
Figure 9A:
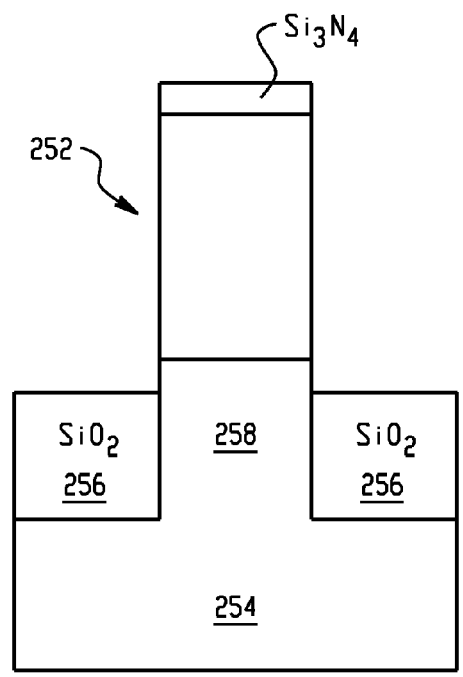
FIGS. 9A-9H are drawings depicting example states of a semiconductor structure during fabrication of a semiconductor device having multiple gate sections with different workfunction levels, in accordance with some embodiments.

FIG. 8 is a process flow chart illustrating another example method of fabricating a semiconductor device having multiple gate sections with different workfunction levels. A vertical channel structure extending from a substrate and formed as a channel between a source region and a drain region is formed (operation 152). The vertical channel structure may be various structures such as a fin that was etched from the substrate (option 154) and/or a nanowire that was grown above the substrate (option 156). FIG. 9A provides a cross-sectional view of an example semiconductor structure after forming a vertical channel structure 252 on a substrate 254 with an oxide region 256 by etching a fin 258 with a nitride hard mask 260.

Figure 9B:
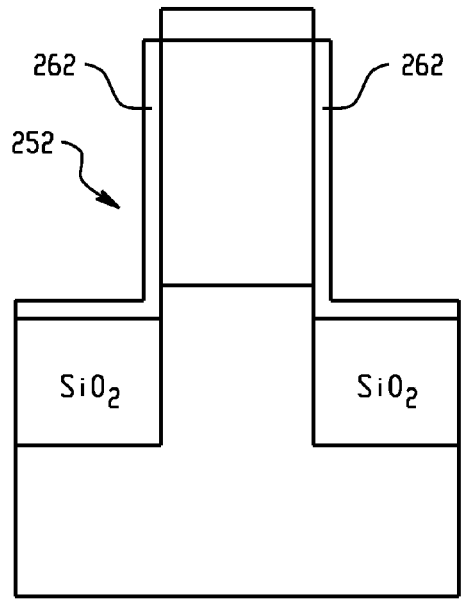

Referring back to FIG. 8, after forming a vertical channel structure, a gate insulator is deposited above the oxide region and around the vertical channel structure (operation 158). FIG. 9B provides a cross-sectional view of an example semiconductor structure after a gate insulator 262 is deposited above the oxide region 256 and around the vertical channel structure 252.

Figure 9C:
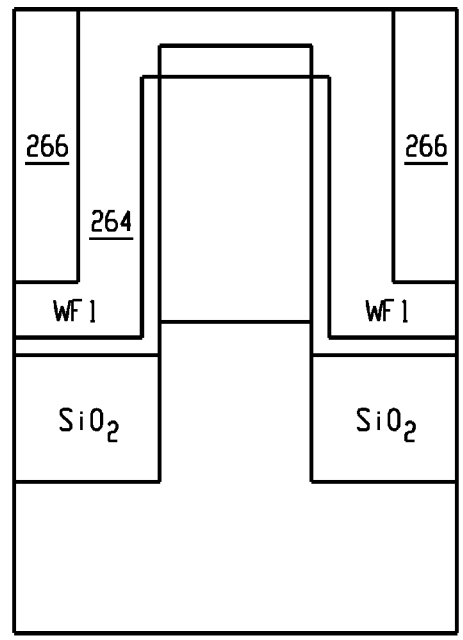
Figure 9D:
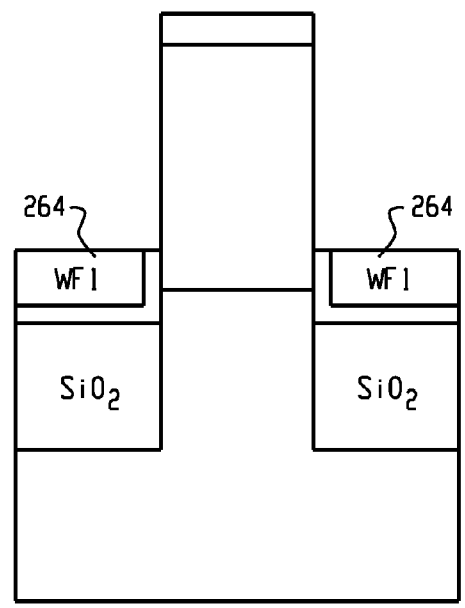

Referring back to FIG. 8, after depositing a gate insulator, a first metal layer is provided (operation 160). Providing a first metal layer may comprise depositing a first metal layer having a first workfunction level followed by depositing an oxide layer, and further followed by chemical mechanical polishing (CMP) operations (operation 162). The first metal layer and oxide layer may then be etched to leave a first metal gate layer having a first thickness level (operation 164). FIG. 9C provides a cross-sectional view of an example semiconductor structure after a first metal gate layer 264 and oxide 266 have been deposited. FIG. 9D provides a cross-sectional view of an example semiconductor structure after etching the first metal layer 264 and oxide to the first thickness level.

Figure 9E:
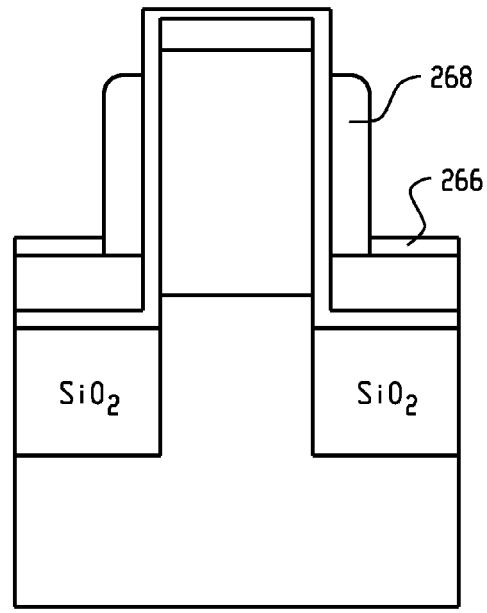
Figure 9F:
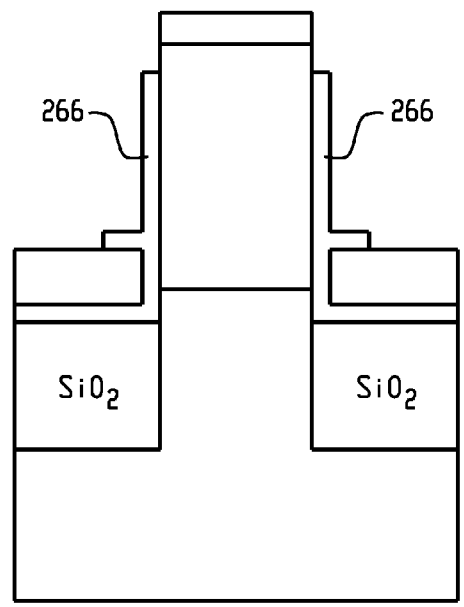

Referring back to FIG. 8, gate isolation can be provided between the first workfunction metal layer and the second workfunction metal layer. This may comprise depositing gate isolation over the first metal layer and forming a spacer above a portion of the gate isolation (operation 168), followed by removing the gate isolation not under the spacer and removing the spacer (operation 170). FIG. 9E provides a cross-sectional view of an example semiconductor structure after depositing gate isolation 266 over the first metal layer 264 and forming a spacer 268 above a portion of the gate isolation 266. FIG. 9F provides a cross-sectional view of an example semiconductor structure after removing the gate isolation 266 not adjacent to the spacer and removing the spacer.

Figure 9G:
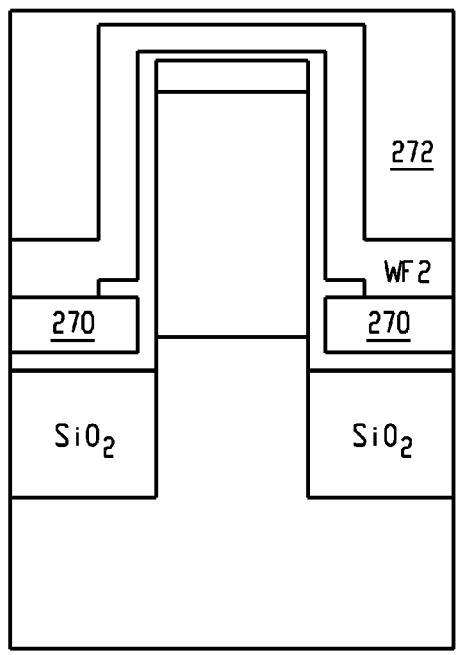

Referring back to FIG. 8, after providing additional gate insulation, a second metal gate layer is provided (operation 172). Providing a second metal gate layer may comprise depositing a second metal layer having a second workfunction level followed by depositing an oxide layer, and further followed by chemical mechanical polishing (CMP) operations (operation 174). The second metal layer and oxide layer may then be etched to leave a second metal layer having a second thickness level (operation 176). The first thickness level and the second thickness level can be chosen to produce a metal gate having a desired gate length. FIG. 9G provides a cross-sectional view of an example semiconductor structure after a second metal layer 270 and oxide 272 have been deposited.

Figure 9H:
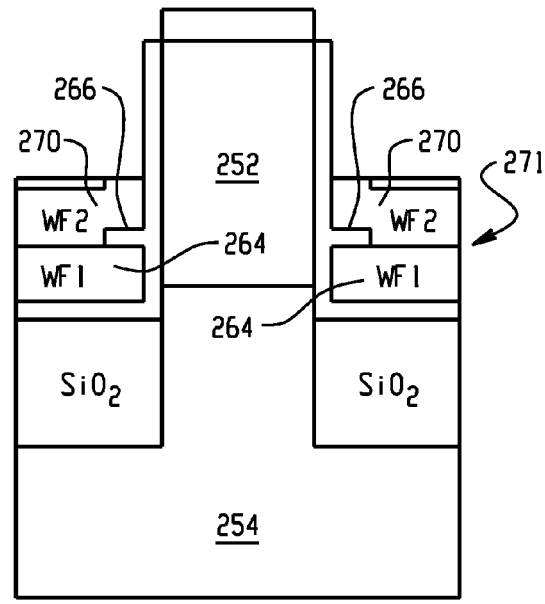

FIG. 9H provides a cross-sectional view of an example semiconductor structure after etching the second metal layer 270 and oxide 272 to the second thickness level. Shown is a semiconductor structure comprising a vertical channel structure 252 extending from a substrate 254 and formed as a channel between a source region and a drain region. The semiconductor structure further comprises a metal gate 271 that surrounds a portion of the vertical channel structure 252. The metal gate 271 has a gate length. The metal gate 271 has a first gate section 264 with a first workfunction and a first thickness. The metal gate 271 also has a second gate section 270 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. A portion of the first metal gate section 264 is separated from a portion of the second metal gate section 270 by intervening gate oxide 266.

Figure 10:
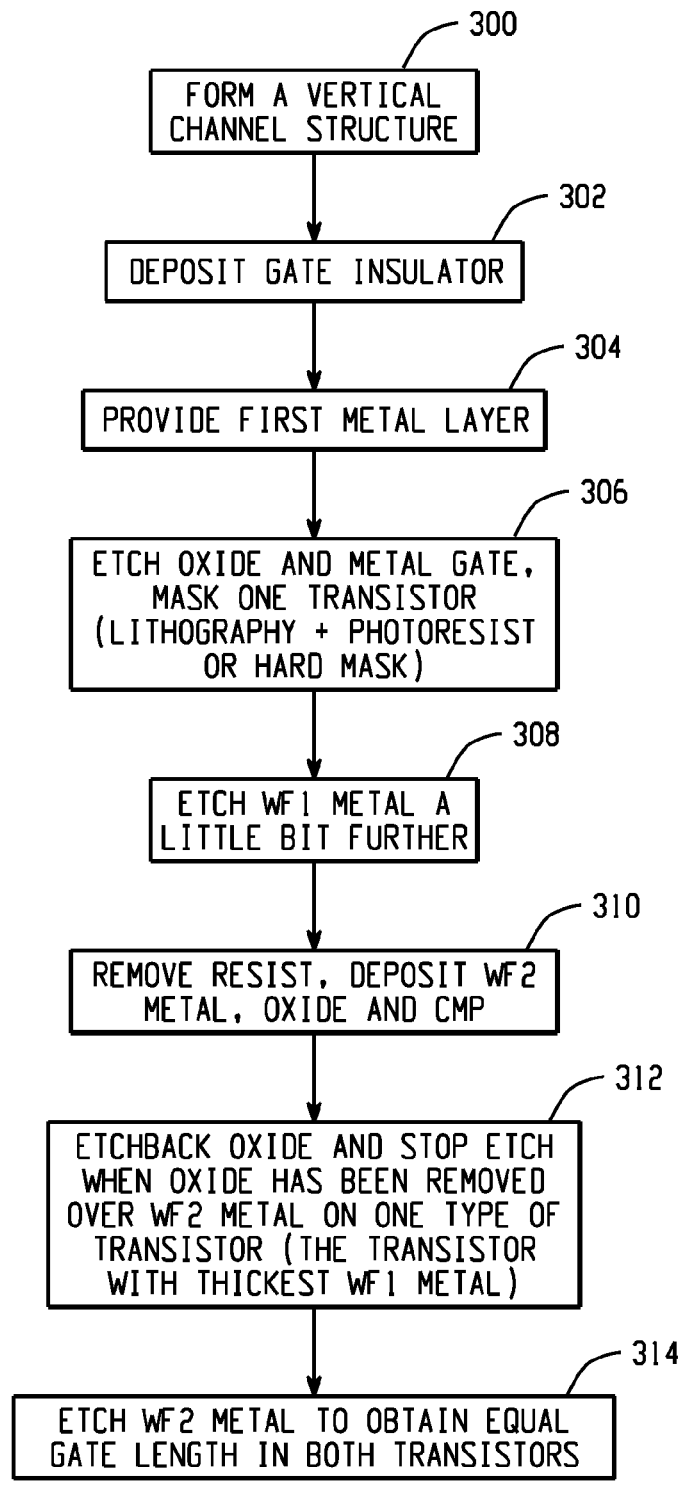
FIG. 10 is a process flow chart illustrating an example method of fabricating a semiconductor structure comprising two devices wherein each device has multiple gate sections with different workfunction levels, in accordance with some embodiments.

FIG. 10 is a process flow chart illustrating an example method of fabricating a semiconductor structure comprising two semiconductor devices having multiple gate sections with different workfunction levels. A vertical channel structure extending from a substrate and formed as a channel between a source region and a drain region is formed for each device (operation 300). Then, a gate insulator is deposited above the oxide region and around the vertical channel structure for each device (operation 302). After depositing a gate insulator, a first metal layer is provided for each device (operation 304). Providing a first metal layer may comprise depositing a first metal gate layer having a first workfunction level followed by depositing an oxide layer, and further followed by chemical mechanical polishing (CMP) operations.

Figure 11A:
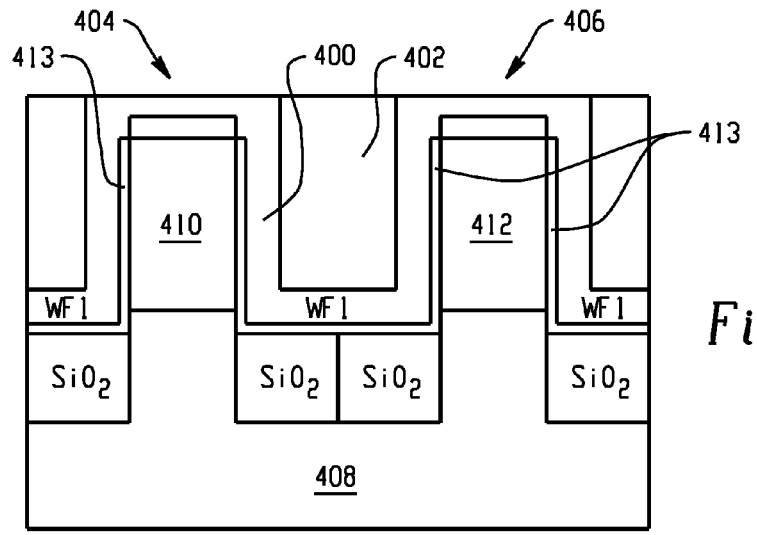
FIGS. 11A-11F are drawings depicting example states of a semiconductor structure during fabrication of multiple semiconductor devices each having multiple gate sections with different workfunction levels, in accordance with some embodiments.

FIG. 11A provides a cross-sectional view of an example semiconductor structure after a first metal layer 400 and oxide 402 have been deposited over a structure comprising a first device 404 and a second device 406. The first and second devices 404, 406 share a substrate 408, each have a vertical channel region 410, 412, and each have gate insulator 413 surrounding the vertical channel regions 410, 412.

Figure 11B:
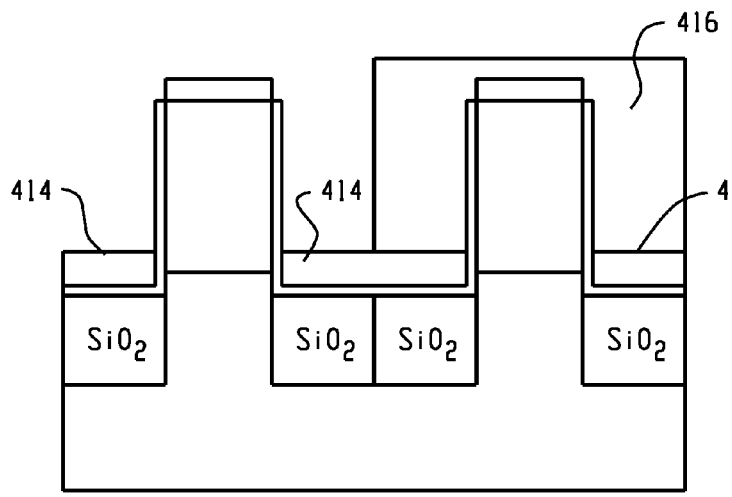

Referring back to FIG. 10, the first metal layer and oxide layer may then be etched (operation 306). Etching, in this example, involves etching the first metal layer and oxide layer to a first thickness level and providing a mask over one of the devices. FIG. 11B provides a cross-sectional view of an example semiconductor structure after etching the first metal layer 414 to a first thickness level and providing a mask 416 over one of the devices. Masking one device may involve lithography and photo resist operations. Masking may also involve applying a hard mask over one of the devices.

Figure 11C:
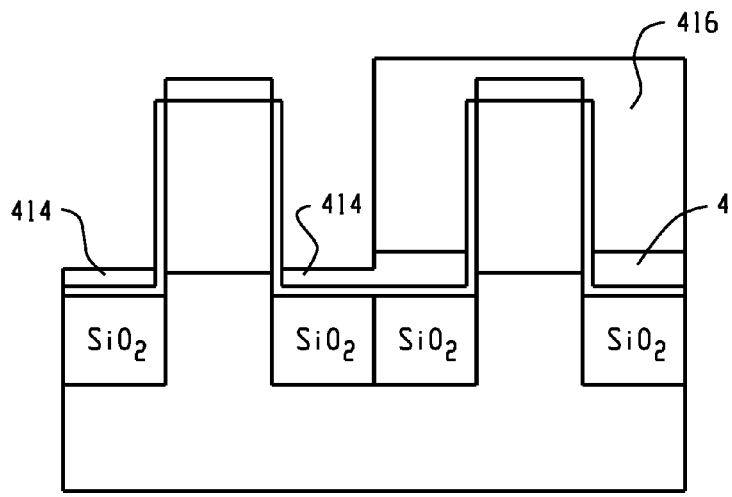

Referring back to FIG. 10, after masking one of the devices, the first metal gate layer in the other device may be etched further to a second thickness level (operation 308). FIG. 11C provides a cross-sectional view of an example semiconductor structure after etching the first metal layer 414 to the second thickness level wherein the second thickness level is lower than the first thickness level.

Figure 11D:
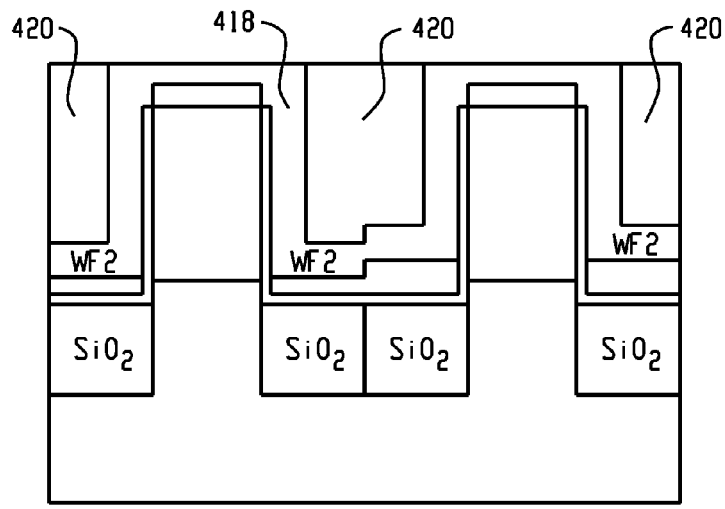

Referring back to FIG. 10, the mask may be removed from the device having the mask. After mask removal, the second metal layer and oxide may be deposited over the two devices and subjected to CMP (operation 310). FIG. 11D provides a cross-sectional view of an example semiconductor structure after depositing the second metal layer 418 and oxide 420.

Figure 11E:
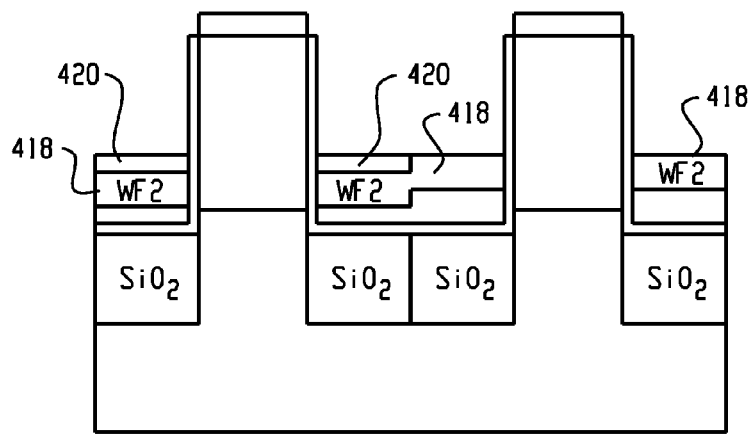

Referring back to FIG. 10, the oxide may be etched back and the etching stopped when the oxide has been removed over the second metal layer on the device with the thickest first metal layer (operation 312). FIG. 11E provides a cross-sectional view of an example semiconductor structure after etching the oxide 420 until oxide has been removed over the second metal layer 418 on the device 406 with the thickest first metal layer 414.

Figure 11F:
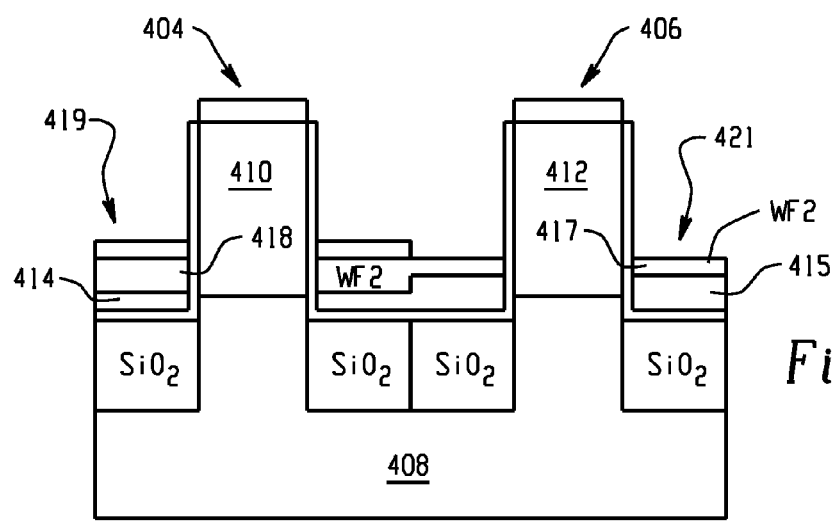

Referring back to FIG. 10, the second metal layer may be etched to obtain equal gate lengths in both devices (operation 314). FIG. 11F provides a cross-sectional view of an example semiconductor structure after etching the second metal layer 418 to obtain equal gate lengths in both devices 404, 406.

Shown is a semiconductor structure comprising a vertical channel structure 410 extending from a substrate 408 and formed as a channel between a source region and a drain region. The semiconductor structure further comprises a metal gate 419 that surrounds a portion of the vertical channel structure 410. The metal gate 419 has a gate length. The metal gate 419 has a first gate section 414 with a first workfunction and a first thickness. The metal gate 419 also has a second gate section 418 with a second workfunction and a second thickness. The first thickness level may be different from the second thickness level and the sum of the first thickness level and the second thickness level is equal to the gate length. The ratio of the first thickness level to the second thickness level for the gate length can be chosen to achieve a particular threshold voltage level for the semiconductor device. The semiconductor structure further comprises a second vertical channel structure 412 extending from the substrate 408 and formed as a channel between a second source region and a second drain region and a second metal gate 421 that surrounds a portion of the second vertical channel structure 412. The second metal gate 421 has a gate length. The second metal gate 421 has a third gate section 415 with the first workfunction and a third thickness. The second metal gate 421 has a fourth gate section 417 with the second workfunction and a fourth thickness. The third thickness may be different from the fourth thickness and the sum of the third thickness and the fourth thickness is equal to the gate length. The ratio of the third thickness to the fourth thickness for the gate length can be chosen to achieve a different threshold voltage level for the portion of the semiconductor structure comprising the second vertical channel 412 and the second metal gate 421.

A resulting semiconductor structure may have multiple devices, such as transistors, with different threshold voltage levels. Both devices may have the same gate length, but one device has a first metal gate layer with a thickness that is different from the thickness of the first metal gate layer in the other device. Similarly, one device may have a second metal gate layer with a thickness that is different from the thickness of the second metal gate layer in the other device. By carefully choosing the relative thickness of the various gate levels in the devices, devices with different threshold voltages may be fabricated on the same substrate.

Using techniques described herein the threshold voltage of a transistor may be tuned using various thicknesses of metal deposition. Using two metals with different threshold voltages (VTH1 and VTH2), the threshold voltage of a device may be tuned between VTH1 and VTH2.

The present disclosure is directed to semiconductor devices, methods of fabricating semiconductor devices, and semiconductor structures. An example semiconductor device includes a vertical channel structure extending from a substrate and formed as a channel between a source region and a drain region. The semiconductor device also includes a first metal gate surrounding a portion of the vertical channel structure and having a gate length. The first metal gate has a first gate section with a first workfunction and a first thickness. The first metal gate also has a second gate section with a second workfunction and a second thickness. The first thickness is different from the second thickness, and the sum of the first thickness and the second thickness is equal to the gate length. A ratio of the first thickness to the second thickness is chosen to achieve a desired threshold voltage level for the semiconductor device.

Another example semiconductor device includes a vertical channel structure that extends from a substrate and is formed between a source region and a drain region. The semiconductor device also includes a metal gate formed around a portion of the vertical channel structure. The metal gate has (i) a first gate section with a first workfunction and a first thickness, and (ii) a second gate section with a second workfunction and a second thickness. The first thickness is different from the second thickness, and a ratio of the first thickness to the second thickness is selected to achieve a desired threshold voltage level for the semiconductor device.

Another example semiconductor device includes a first vertical channel structure that extends from a substrate and is formed between a first source region and a first drain region. The semiconductor device also includes a first metal gate formed around a portion of the first vertical channel structure, where the first metal gate has (i) a first gate section with a first workfunction and a first thickness, and (ii) a second gate section with a second workfunction and a second thickness. A ratio of the first thickness to the second thickness is selected to achieve a first threshold voltage level. The semiconductor device also includes a second vertical channel structure that extends from the substrate and is formed between a second source region and a second drain region. The semiconductor device further includes a second metal gate formed around a portion of the second vertical channel structure. The second metal gate has (i) a third gate section with the first workfunction and a third thickness, and (ii) a fourth gate section with the second workfunction and a fourth thickness. A ratio of the third thickness to the fourth thickness is selected to achieve a second threshold voltage level that is different than the first threshold voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a vertical channel structure extending from a substrate and formed as a channel between a source region and a drain region; and
a first metal gate surrounding a portion of the vertical channel structure and having a gate length, the first metal gate having a first gate section with a first workfunction and a first thickness, the first metal gate having a second gate section with a second workfunction and a second thickness, wherein the first thickness is different from the second thickness and the sum of the first thickness and the second thickness is equal to the gate length, a ratio of the first thickness to the second thickness being chosen to achieve a desired threshold voltage level for the semiconductor device.

2. The semiconductor device of claim 1, wherein the desired threshold voltage level for the semiconductor device is less than a threshold voltage level that the semiconductor device could obtain if the second thickness was equal to the gate length and greater than a threshold voltage level that the semiconductor device could obtain if the first thickness was equal to the gate length.

3. The semiconductor device of claim 1, wherein the first gate section is closer to the substrate than the second gate section, the second workfunction is greater than the first workfunction, and an effective workfunction for the semiconductor device is less than the second workfunction and greater than the first workfunction.

4. The semiconductor device of claim 3, wherein the semiconductor device is an N-channel device and the desired threshold voltage level for the semiconductor device is less than a threshold voltage level that the semiconductor device could obtain if the second thickness was equal to the gate length and greater than a threshold voltage level that the semiconductor device could obtain if the first thickness was equal to the gate length.

5. The semiconductor device of claim 1, wherein a portion of the first gate section is separated from a portion of the second gate section by intervening gate oxide.

6. The semiconductor device of claim 1, further comprising:
a second vertical channel structure extending from the substrate and formed as a channel between a second source region and a second drain region; and
a second metal gate surrounding a portion of the second vertical channel structure and having the gate length, the second metal gate having a third gate section with the first workfunction and a third thickness, the second metal gate having a fourth gate section with the second workfunction and a fourth thickness, wherein the third thickness is different from the fourth thickness and the sum of the third thickness and the fourth thickness is equal to the gate length, and wherein a ratio of the third thickness to the fourth thickness was chosen to achieve a different threshold voltage level for the portion of the semiconductor structure comprising the second vertical channel and the second metal gate.

7. The semiconductor device of claim 6, wherein a portion of the first gate section is separated from a portion of the second gate section by intervening gate oxide, and a portion of the third gate section is separated from a portion of the fourth gate section by intervening gate oxide.

8. The semiconductor device of claim 1, wherein the first gate further comprises low resistivity metal surrounding the first gate section and the second gate section.

9. A semiconductor device comprising:
a vertical channel structure that extends from a substrate and is formed between a source region and a drain region; and
a metal gate formed around a portion of the vertical channel structure, the metal gate having (i) a first gate section with a first workfunction and a first thickness, and (ii) a second gate section with a second workfunction and a second thickness, the first thickness being different from the second thickness, a ratio of the first thickness to the second thickness being selected to achieve a desired threshold voltage level for the semiconductor device.

10. The semiconductor device of claim 9, wherein the desired threshold voltage level for the semiconductor device is less than a threshold voltage level that the semiconductor device could obtain if the second thickness was equal to the gate length and greater than a threshold voltage level that the semiconductor device could obtain if the first thickness was equal to the gate length.

11. The semiconductor device of claim 9, wherein the first gate section is closer to the substrate than the second gate section, the second workfunction is greater than the first workfunction, and an effective workfunction for the semiconductor device is less than the second workfunction and greater than the first workfunction.

12. The semiconductor device of claim 11, wherein the semiconductor device is an N-channel device and the desired threshold voltage level for the semiconductor device is less than a threshold voltage level that the semiconductor device could obtain if the second thickness was equal to the gate length and greater than a threshold voltage level that the semiconductor device could obtain if the first thickness was equal to the gate length.

13. The semiconductor device of claim 9, wherein a portion of the first gate section is separated from a portion of the second gate section by intervening gate oxide.

14. The semiconductor device of claim 9, further comprising:
a second vertical channel structure extending from the substrate and formed as a channel between a second source region and a second drain region; and
a second metal gate surrounding a portion of the second vertical channel structure and having the gate length, the second metal gate having a third gate section with the first workfunction and a third thickness, the second metal gate having a fourth gate section with the second workfunction and a fourth thickness, wherein the third thickness is different from the fourth thickness and the sum of the third thickness and the fourth thickness is equal to the gate length, and wherein the ratio of the third thickness to the fourth thickness was chosen to achieve a different threshold voltage level for the portion of the semiconductor structure comprising the second vertical channel and the second metal gate.

15. The semiconductor device of claim 14, wherein a portion of the first gate section is separated from a portion of the second gate section by intervening gate oxide, and a portion of the third gate section is separated from a portion of the fourth gate section by intervening gate oxide.

16. The semiconductor device of claim 9, wherein the first gate further comprises low resistivity metal surrounding the first gate section and the second gate section.

17. A semiconductor device comprising:
a first vertical channel structure that extends from a substrate and is formed between a first source region and a first drain region;
a first metal gate formed around a portion of the first vertical channel structure, the first metal gate having (i) a first gate section with a first workfunction and a first thickness, and (ii) a second gate section with a second workfunction and a second thickness, a ratio of the first thickness to the second thickness being selected to achieve a first threshold voltage level;
a second vertical channel structure that extends from the substrate and is formed between a second source region and a second drain region; and
a second metal gate formed around a portion of the second vertical channel structure, the second metal gate having (i) a third gate section with the first workfunction and a third thickness, and (ii) a fourth gate section with the second workfunction and a fourth thickness, a ratio of the third thickness to the fourth thickness being selected to achieve a second threshold voltage level that is different than the first threshold voltage level.

18. The semiconductor device of claim 17, wherein a portion of the first gate section is separated from a portion of the second gate section by intervening gate oxide, and a portion of the third gate section is separated from a portion of the fourth gate section by intervening gate oxide.

19. The semiconductor device of claim 17, wherein the first metal gate further comprises low resistivity metal surrounding the first gate section and the second gate section.

20. The semiconductor device of claim 17, wherein the first gate section is closer to the substrate than the second gate section, and the second workfunction is greater than the first workfunction.

* * * * *